(12) United States Patent
Baiza

(10) Patent No.: US 6,523,918 B1
(45) Date of Patent: Feb. 25, 2003

(54) PIVOT MOUNTING BRACKET WITH TOOLLESS FASTENER FOR A SERVER RACK

(75) Inventor: Julian S. Baiza, Arlington, TX (US)

(73) Assignee: Central Industrial Supply Company, Inc., Grand Prairie, TX (US)

( * ) Notice: Subject to any disclaimer, the term of this patent is extended or adjusted under 35 U.S.C. 154(b) by 0 days.

(21) Appl. No.: 09/841,577

(22) Filed: Apr. 24, 2001

(51) Int. Cl.[7] .............................. A47G 29/00; A47F 5/00
(52) U.S. Cl. ................................ 312/265.1; 312/223.1; 211/26; 248/289.11
(58) Field of Search ........................... 312/265.1, 265.2, 312/265.3, 350, 351, 223.1, 223.2, 311, 330.1, 334.1; 211/26, 151; 248/289.11; 16/319, 374; 211/183, 189, 190

(56) References Cited

U.S. PATENT DOCUMENTS

| | | | | |
|---|---|---|---|---|
| 4,135,273 A | * | 1/1979 | Holmes .................... 16/319 X |
| 4,895,333 A | * | 1/1990 | Antinora ................ 248/289.11 |
| 4,930,738 A | * | 6/1990 | Lombardo ............. 248/289.11 |
| 5,312,005 A | | 5/1994 | Odell |
| 5,571,256 A | * | 11/1996 | Good et al. .......... 312/223.1 X |
| 5,706,173 A | | 1/1998 | Carney et al. |
| 5,765,698 A | | 6/1998 | Bullivant |
| 5,791,498 A | | 8/1998 | Mills |
| 5,992,808 A | | 11/1999 | Morrow |
| 6,021,909 A | * | 2/2000 | Tang et al. .......... 312/265.1 X |
| 6,042,203 A | | 3/2000 | Bogucki |
| 6,049,451 A | | 4/2000 | Schmidt et al. |
| 6,070,957 A | * | 6/2000 | Zachrai ............... 312/265.1 X |
| 6,123,302 A | | 9/2000 | Gibbons |
| 6,142,590 A | * | 11/2000 | Harwell ................... 312/223.1 |

* cited by examiner

Primary Examiner—James O. Hansen
(74) Attorney, Agent, or Firm—Mark W. Handley; Chauza & Handley, L.L.P.

(57) ABSTRACT

A pivot mounting bracket (12) for a server rack (2) includes a bracket plate (18), a pivot member (20) and a clasp member (26), which are pivotally mounted to a pin (36). The pivot member (20) has two spaced apart mounting ears (34) for receiving the pin (36). Two clips (38) secure the pin (36) within the mounting ears (34). A slot (24) extends in the pivot member (20) for receiving a thumb screw (22). The clasp member (26) has a threaded hole (28) for receiving an end (30) of the thumb screw (22) to clamp the pivot member (20) and the clasp member (26) to the server rack frame (14). The clasp member (26) includes two locating tabs (32) which extend at right angles to a main body (33) of the clasp member (26) for inserting within mounting apertures (16) of the server rack frame (14) to locate the clasp member (26) and the mounting bracket (12) relative to the rack frame (14).

15 Claims, 4 Drawing Sheets

PIVOT MOUNTING BRACKET WITH TOOLLESS FASTENER FOR A SERVER RACK

BACKGROUND OF THE INVENTION

Server system racks are provided for housing equipment, such as network servers, telephone switches, power supplies, and the like. Various components have been rigidly secured to the server system racks by use of fasteners. One type of such components which are secured to the server system racks are cable management arms for securing cables between the rack frames of the server system racks and equipment drawers which move relative to the server system rack frames. The cable management arms are secured to the server system racks such that linkages of the cable management arm are pivotally secured to the server system rack frames to allow the linkages of the cable management arm to fold and unfold as the equipment drawers are moved into and out of the server system racks. Cable management arms have been secured to the rack frames using threaded fasteners, which have included bolts and screws that require hand tools to secure the various components to the server system racks. Components can be assembled to server system racks much more quickly and efficiently without using fasteners that require hand tools.

SUMMARY OF THE INVENTION

A pivot mounting bracket is provided for mounting a cable management arm to a rack fame of a server system rack. The pivot mounting bracket mounts directly to a rack frame of a server system rack. Preferably, the rack frame is of the type having connected members in which are formed mounting apertures which are spaced apart in a regular pattern that runs the length of the connected members of the rack frame. The regular pattern of the apertures in rack frame preferably has different spacings between various ones of the apertures, in a repeating pattern. The pivot mounting bracket includes a bracket plate, a pivot member and a clasp member which are pivotally mounted to a pin member. The pin member provides a hinge pin which defines a hinge means that is common to the bracket plate, the pivot member and the clasp member. A thumb screw secures the pivot member and the clasp member together to clamp against opposite sides of a portion of the rack frame, with the bracket plate pivotally mounted to the pivot member and the clasp member by the hinge means. The bracket plate and the clasp member have tab portions which are formed into hinge loops for fitting around of the periphery of the pin member to pivotally secure the bracket plate and the clasp member to the pin member. The tab portions forming the hinge loops extend from singular ends of respective ones of the bracket plate and the clasp member. The pivot member has two mounting tabs that extend on opposite ends of a main body portion of the pivot member to define two lugs or mounting ears. The two mounting ears have respective apertures which are spaced apart and face one another for receiving the pin member. Two fasteners pivotally secure the pin member within the respective apertures of the mounting ears of the pivot member, with the hinge loops of the clasp member and the bracket plate fitting around the pin member and captured between the mounting ears of the pivot member.

Two clinch nuts are fixedly secured to in a main body of the clasp member. The two clinch nuts each have a threaded hole, and are secured to the clasp member in a spaced apart alignment to define two spaced apart, threaded holes in the clasp member. The clasp member further has two locating tabs which are spaced apart and extend at right angles to a plane of the main body of a clasp member. The two locating tabs are spaced apart for fitting into respective ones of two spaced apart mounting apertures of the server system rack frame to locate the pivot mounting bracket relative to the rack frame. At least one intermediate mounting aperture of the rack frame is disposed between the respective mounting apertures which receive the two locating tabs. The spacing between the clinch nuts is narrower than the spacing between the two locating tabs of the clasp member. The clinch nuts are positioned relative to the two locating tabs, such that one of the regularly spaced, intermediate mounting apertures in the rack frame will align with at least one of the threaded holes in the clinch nuts when either end of the clasp member is located in an upwards position relative to the other end of the clasp member. Whether the pivot mounting bracket is mounted in a right-hand position, to a right side of the server system rack, or in a left-hand position, to the left side of the server system rack, at least one of the threaded holes in the two clinch nuts will be aligned with one of the intermediate, regularly spaced mounting apertures in the rack frame when the two locating tabs of the clasp member are disposed in the two spaced apart mounting apertures.

A slot is formed in the pivot member for receiving the thumb screw, which is preferably captured within the slot. The slot in the pivot mounting bracket is located such that the captive thumb screw may be moved in the slot for selectively aligning with either one of the two clinch nuts, for passing a threaded end of the captive thumb screw through the intermediate mounting aperture and into the threaded hole of the respective one of the clinch nuts that is registered with the intermediate mounting aperture. The thumb screw is then threadingly engaged with the clinch nut. The slot in the pivot mounting bracket allows the thumb screw to move between two positions, a first position for registering with the threaded hole in a first one of the two clinch nuts and a second position for registering with the threaded hole in the other of the two clinch nuts, such that the pivot mounting bracket may be used in either a right-hand mounting position or a left-hand mounting position with respect to the rack frame of the server system rack.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
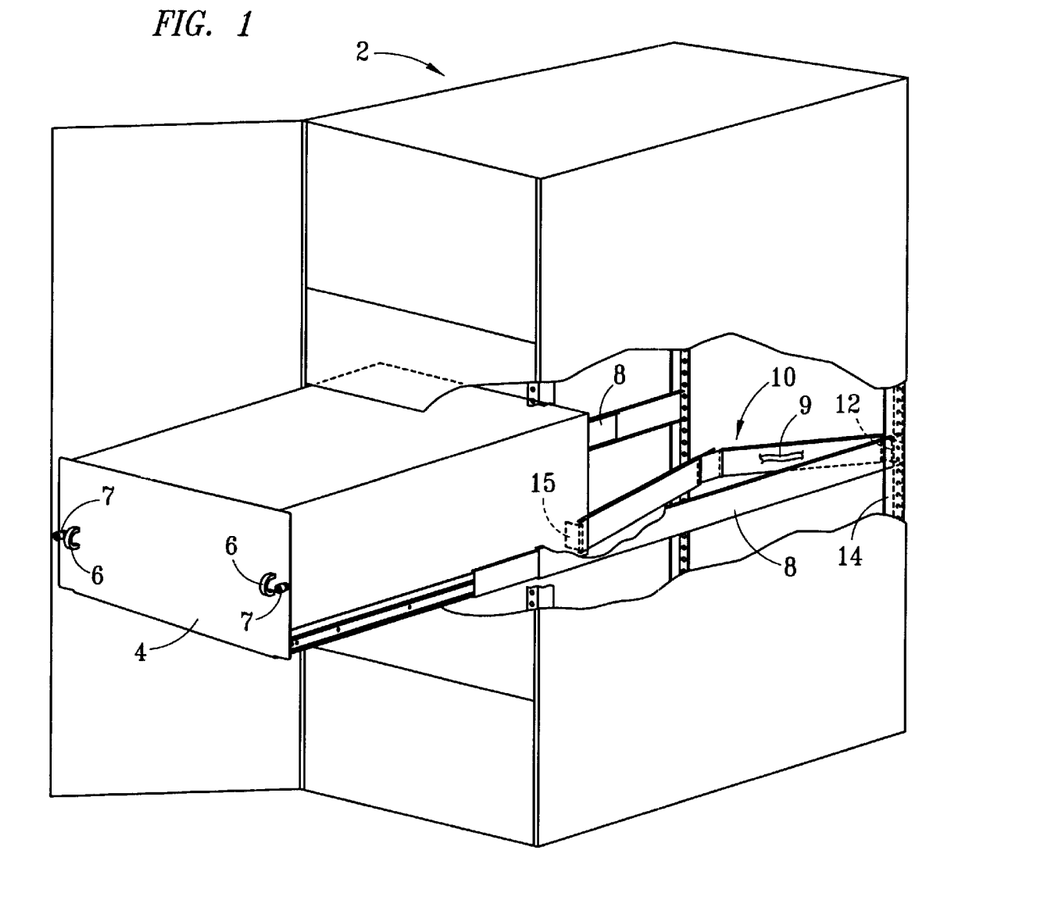
FIG. 1 is a perspective view of a server system rack having a pivot mounting bracket with a toolless fastener made according to the present invention.

FIG. 1 is a perspective view of a server system rack 2 having an equipment drawer 4, which houses an electronics unit, such as a network server, a telephone switch, a power supply, or the like. A forward face of the equipment drawer 4 preferably has handles 6 and latches 7. The equipment drawer 4 is slidably mounted to the server system rack 2 by two slide rails 8, which extend between opposite sides of the equipment drawer 4 and the server system rack 2. Preferably, the latches 7 can be released to allow the equipment drawer 4 to slide forward of the server system rack 2 on the slide rails 8. Cabling 9 extends from the equipment drawer 4 to other components of the server system rack 2. The cabling 9 is secured between the equipment drawer 4 and the server system rack by means of a cable management arm 10.

The cable management arm 10 is shown in an extended position, or elongated, position. The cable management arm 10 is disposed in the extended position, or elongated position, when the equipment drawer 4 is moved to extend outward of the cabinet of the server system rack 2. The frame 14 of the server system rack 2 is preferably of the type having regularly spaced apertures 16 (shown in FIGS. 4 and 5), which are formed into the frame 14, along longitudinally extending lengths of the frame 14. A forward mounting bracket 15 secures a forward end of the cable management arm 10 to a rearward end of the equipment drawer 4. A pivot mounting bracket 12 pivotally secures a rearward end of the cable management arm 10 to the server system rack frame 14. The pivot mounting bracket 12 includes a toolless fastener for securing the pivot mounting bracket 12, and the cable management arm 10, directly to a rack frame 14 of the server system rack 2. The toolless fastener for the mounting bracket 12 is provided by a thumbscrew 22. (Shown in FIG. 3).

Figures 2, 3:
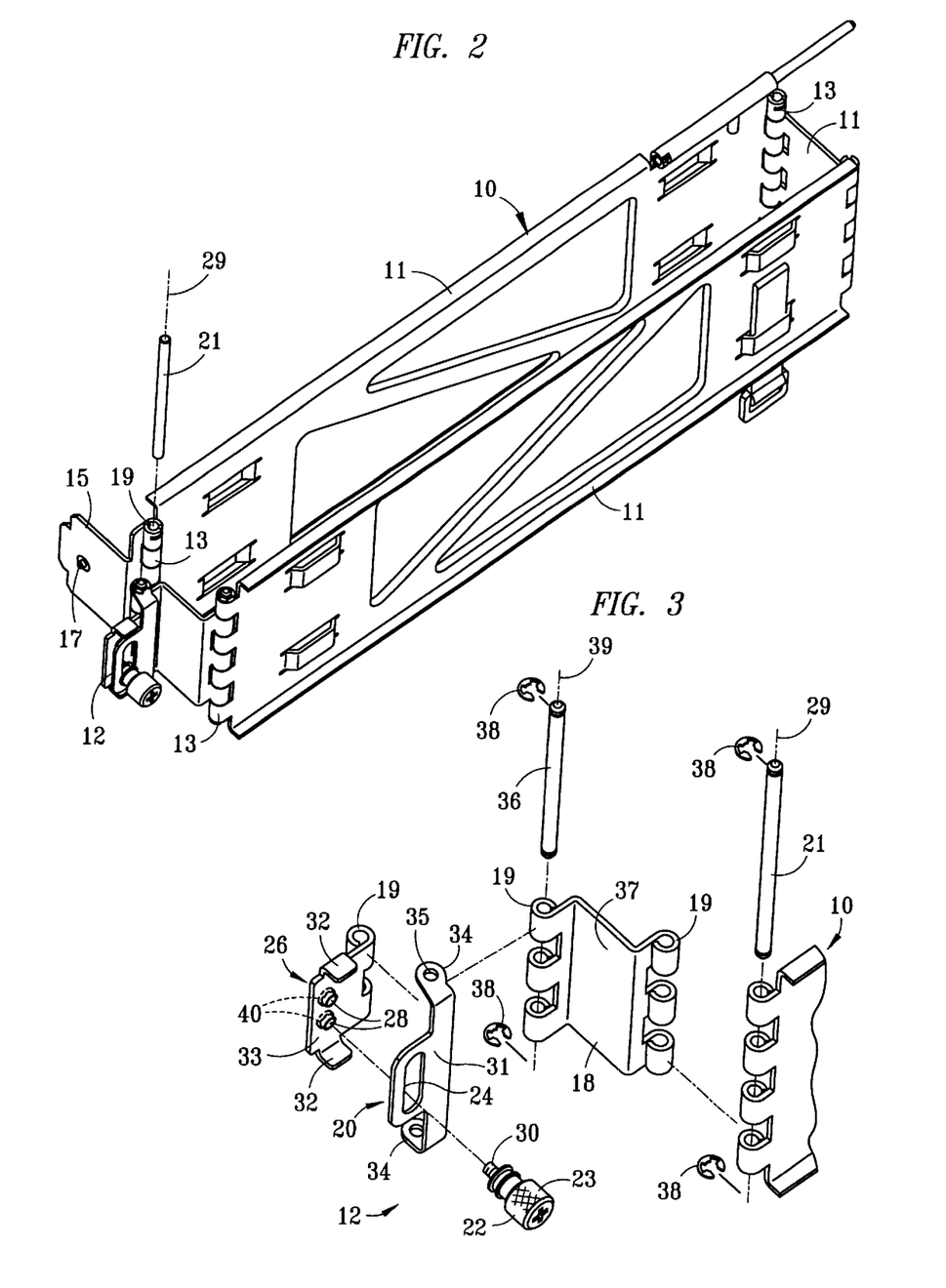
FIG. 2 is a perspective view of a cable management arm included within the server system rack, with the pivot mounting bracket mounted to one end of the cable management arm.
FIG. 3 is an exploded, perspective view of the pivot mounting bracket, showing the various components thereof.

FIG. 2 is a perspective view of a cable management arm 10, shown in a folded position, or retracted position, which is similar to the position in which the cable management arm 10 would be disposed if the equipment drawer 4 of FIG. 1 were moved rearward, from the position shown in FIG. 1, into a stowed position, disposed fully within the cabinet of the server system rack 2. The cable management arm 10 includes a plurality of linkages 11, preferably three linkages 11. A central one of the linkages 11 is shorter than the other two of the three linkages 11. The forward mounting bracket 15 is preferably provided by a flat plate which is formed into a L-shaped bracket. The forward mounting bracket 15 is secured to the rearward portion the equipment drawer 4 (shown in FIG. 1) by a thumbscrew 17, which is secured into a threaded hole in the rearward end of the equipment drawer 4 (shown in FIG. 1).

A plurality of hinges 13 pivotally secure the mounting bracket 15 to the cable management arm 10, and pivotally secure the various linkages 11 of the cable management arm 10 together for rotating about the axes 29. The hinges 13 provide hinge means which include hinge pins 21 and various sockets defined by hinge loops 19 for pivotally receiving the hinge pins 21. The hinge pins 21 have longitudinal axes 29 which define the axes about which the various linkages 11 of the cable management arm 10 rotate. The hinge pins 21 are received within the hinge loops 19, and then secured in place with E-clips 38 (also shown in FIG. 3), which are snap-ring type clips having a somewhat rounded, E-shape. The E-clips 39 engage within circumferentially extending grooves defined in the exterior periphery of the hinge pins 21. One of the hinges 13 pivotally secures the pivot mounting bracket 12 to the rearward end of the cable management arm 10, by means of one of the hinge pins 21.

FIG. 3 is an exploded, perspective view of the pivot mounting bracket 12 showing the various components thereof. The pivot mounting bracket 12 includes a bracket plate 18, a pivot member 20 and a clasp member 26, which are pivotally mounted to a pin member 36 for rotating about the axis 39. Preferably, the pin member 36 is similar to one of the hinge pins 21, only shorter, and defines a hinge means. The pin member 36 has a central, longitudinal axis 39 which defines the axis about which the bracket plate 18, the pivot member 20 and the clasp member 26 rotate when pivotally secured together by the pin member 36. The bracket plate 18 and the clasp member 26 have tab portions which are formed into hinge loops 19 for fitting around of the cylindrically shaped periphery of the pin member 36 to pivotally secure the bracket plate 18 and the clasp member 26 to the pin member 36. The pin members 21 and 36 have cylindrically shaped peripheries which, together with the hinge loops 19, provide hinge means which are common to and rotatably secure together the bracket plate 18, the pivot member 20 and the clasp member 26 for rotating about the common axis 39.

The bracket plate 18 has a main body portion 37, having a planar surface and two sides, or opposite ends, which are formed to extend perpendicular to the main, planar surface of the main body portion 37. The bracket plate 18 has the tab portions which extend from the two opposite ends of the main body portion 37, and which are formed to provide the hinge loops 19. The hinge loops 19 are sized and shaped for receiving the cylindrical periphery of the pin member 36 to pivotally secure the bracket plate 18 to the pin member 36, the pivot member 20 and the clasp member 26. The hinge loops 19 on opposite ends of the bracket plate 18 fit between, or intermesh, with the hinge loops 19 of the end of one of the linkages 11 of the cable management arm 10, on one end of the bracket plate 18, and the hinge loops 19 of the clasp member 26, on the other end of the bracket plate 18. The hinge loops 19 of the bracket plate 18 are formed such that the main planar surface defined by the main body portion 37 will extend parallel to the longitudinal axis 39 of the pin member 36, and will remain parallel to the longitudinal axis 39, while the bracket plate 18 is rotated about the longitudinal axis 39 of the pin member 36.

The clasp member 26 has a main body portion which defines a planar surface 33. Two threaded holes 28 are provided in the planar surface 33 of the main body portion for receiving the threaded shank 30 of the thumb screw 22. Two clinch nuts 40 define two spaced apart, threaded holes 28 in the planar surface 33 of the clasp member 26. The two clinch nuts 40 are fixedly secured to the clasp member 26 in spaced apart arrangement, such that the two threaded holes 28 are aligned in parallel for receiving the shank of the thumb screw 22.

The clasp member 26 has two tab portions which extend from one side of the planar surface 33, and which are formed to provide the hinge loops 19 for extending around the cylindrical periphery of the pin member 36. The hinge loops 19 pivotally secure the clasp member 26 to the pin member 36, for rotating relative to the longitudinal axis 39 of the pin member 36. The hinge loops 19 of the clasp member 26 are formed such that the longitudinal axis 39 of the pin member 36 is parallel to the plane of the planar surface 33 of the clasp member 36, and the planar surface 33 will rotate about the longitudinal axis 39 while remaining parallel to the longitudinal axis 39.

The clasp member 26 further has two locating tabs 32 which are spaced apart and which extend from opposite sides of the clasp member 26, at right angles to a planar surface 33 of the main body of the clasp member 26 and perpendicular to the axis 39 of the pin member 36. The two locating tabs 32 of the clasp member 26 are two planar locating ears which extend in parallel and which are spaced apart for fitting into respective ones of two spaced apart mounting apertures 16 of the server system rack frame 14 to locate the pivot mounting bracket 12 relative to the rack frame 14. The spacing between the two parallel locating tabs 32 defines a line which is perpendicular to the two locating tabs 32, and parallel to the longitudinal axis 39 of the pin member 36, about which the planar surface 33 of the clasp member 26 rotates.

At least an intermediate one of the mounting apertures 16 of the rack frame 14 is disposed between the two spaced apart ones of the mounting apertures 16 which receive the two locating tabs 32. The spacing between the clinch nuts 40 is narrower than the spacing between the two locating tabs 32 of the clasp member 26, and the clinch nuts 40 are positioned relative to the two locating tabs 32, such that one of the regularly spaced, intermediate mounting apertures 16 in the rack frame 14 will align with at least one of the clinch nuts 40 when either end of the clasp member 26 is located in an upwards position relative to the other end of the clasp member 26. Whether the pivot mounting bracket 12 is mounted in a right-hand position, mounted to a right side of the server system rack 14, or in a left-hand position, mounted to the left side of the server system rack 14, one of the two clinch nuts 40 will be aligned with one of the regularly spaced mounting apertures 16 in the rack frame 14 when the two locating tabs 32 of the clasp member 26 are disposed in the two spaced apart ones of the mounting apertures 16.

The pivot member 20 has a planar-shaped main body 31, which defines two, parallel planar surfaces. The longitudinal ends of the main body 31 of the pivot member 20 includes two tabs, or lugs, which extend outward of opposite sides of a main body of the pivot member 20 to define mounting ears 34. The mounting ears 34 are parallel, have respective apertures 35 and face one another for rotatably receiving the pin member 36. The pin member 36 is preferably secured in the apertures 35 of the two mounting ears 34 by two of the E-clips fasteners 38. The two clip-type fasteners 38 pivotally secure the pin member 36 within the respective apertures 35 of the mounting ears 34 of the pivot member 20, with the hinge loops 19 of the clasp member 26 and the bracket plate 18 fitting around the pin member 36 and captured between the mounting ears 35 of the pivot member 20.

A slot 24 having an elongated shape is formed in the planar surfaces of the planar shaped main body portion 37 of the pivot member 20 for receiving the thumb screw 22. The thumb screw 22 is preferably captured within the slot 24. The slot 24 has a longitudinal length along which the thumb screw 22 is slidably moveable from one end of the elongated slot 24 to the other. The longitudinal length of the elongated slot 24 defines a longitudinal axis which is preferably parallel to the longitudinal axis 39 of the pin member 36, when the pivot member 20 is rotatably secured to the pin member 36. The thumb screw 22 has a threaded shank 30 and a head 23. The head 23 is knurled such that a user may grip the head 23 between a thumb and a finger to turn the thumb screw 22. The thumb screw 22 secures the pivot member 20 and the clasp member 26 together against opposite sides of a portion of the rack frame 16, with the portion of the rack frame 16 clamped between the pivot member 20 and the clasp member 26.

The elongated slot 24 also preferably runs parallel to the longitudinal axis 27 of a post 25 of the frame 14. (Shown in FIG. 4). The slot 24 is located in the pivot member 20 such that the captive thumb screw 22 may be moved in the slot 24 for selectively aligning with either one of the threaded holes 28 of the clinch nuts 40. Once the pivot mounting bracket 12 is located with respect to the rack frame 14, a threaded end 30 of the captive thumb screw 22 is passed through the intermediate one of the mounting aperture 16 and into one of the clinch nut 40. The thumb screw 22 is then threadingly engaged with the particular clinch nut 40 which is registered with the intermediate one of the mounting apertures 16. The slot 24 in the pivot mounting bracket 12 allows the thumb screw 22 to move between two positions, a first position for registering with one of the threaded holes 28 in the two clinch nuts 40, and a second position for registering with the other of the threaded holes 28 in the two clinch nuts 40 of the clasp member 26, such that the pivot mounting bracket 12 may be used in either a right-hand or a left-hand position with respect to the server rack frame 14.

Figure 4:
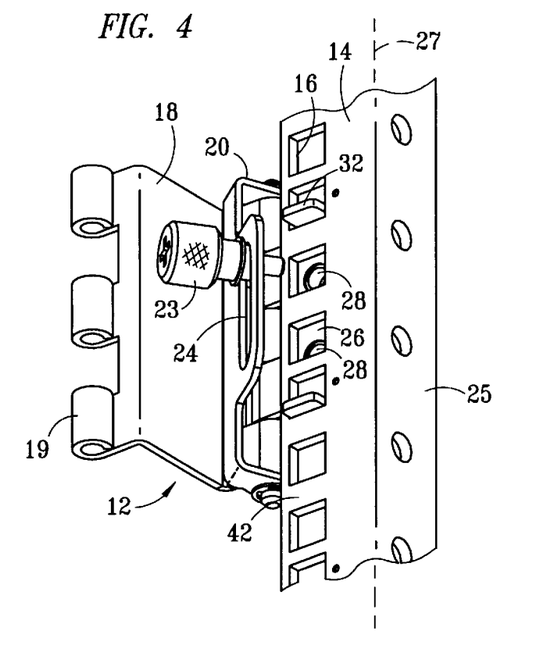
FIG. 4 is a perspective view of the pivot mounting bracket and the frame of the server system rack, showing the pivot mounting bracket in an open position.

FIG. 4 is a perspective view of the pivot mounting bracket 12 and the frame 14 of the rack 2, showing the pivot mounting bracket 12 engaged with a flange 42 of the frame and in an open position, prior to being secured to the flange 42. Preferably, the rack frame 14 is of the type having mounting apertures 16 which are spaced apart in a regular pattern that runs the length of the rack frame 14. The regular pattern of the apertures 16 in rack frame 14 preferably has different spacings between various ones of the apertures 16, in a repeating pattern. The two locating tabs 32 of the clasp member 26 are shown extending through the apertures 16 in the frame 14, with the planar surface 33 in the main body of the clasp member 26 being disposed flush against a planar surface of the flange 42 portion defined by the frame 14. Preferably, the two locating tabs 32 are spaced apart for engaging in separate ones of the mounting holes 16 of the frame 14, and fit flush against sides of the mounting holes 16. The slot 24 in the main body 31 of the pivot member 20 will register with at least one of the frame apertures 16, which is preferably disposed between the two of the apertures 16 which receive the two locating tabs 32. The thumb screw 22, which is captured in the elongated slot 24, will pass from the elongated slot 24, through the one of the apertures 16 which registers with the elongated slot 24, for securing within one of the threaded holes 28 of the clinch nuts 40 which are fixedly secured to the clasp member 26.

Figure 5:
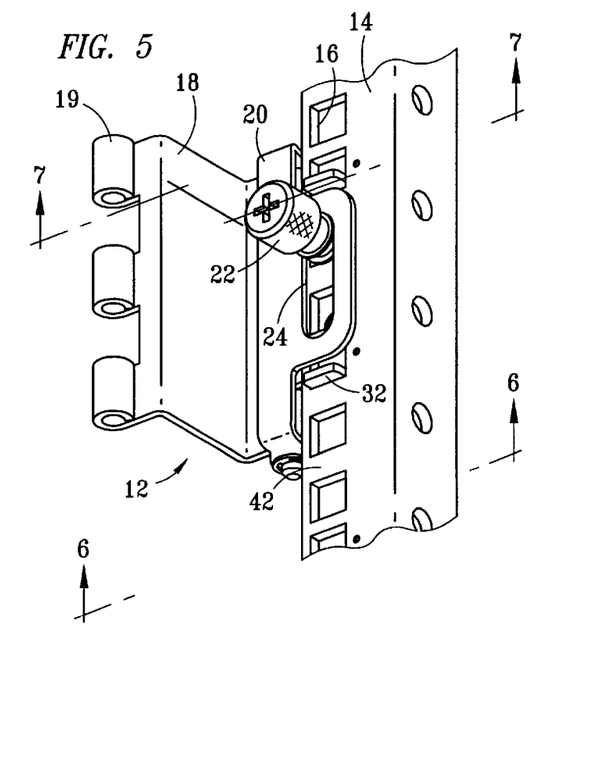
FIG. 5 is a perspective view of the pivot mounting bracket and the frame of the server system rack, showing the pivot mounting bracket in a latched position.

FIG. 5 is a perspective view of the mounting bracket 12 and the frame 14, showing the pivot mounting bracket 12 in the latched position, fastened to the frame 14. The pivot member 20 is rotated relative to the rack frame 14 and the bracket plate 18 to align the threaded shank 30 of the thumb screw 22 with one of the threaded holes 28 provided in the clasp member 26. The thumb screw 22 is then rotated to threadingly engage the threaded shank 30 within one of the threaded holes 28 to secure the thumb screw 22 and the pivot member 20 to the clasp member 26, clamping the flange 42 of the rack frame 14 between the pivot member 20 and the clasp member 26. This latches the pivot member 20 in a fixed position, such that the planar surface 33 of the clasp member 26 is fitting flush against one side of the frame 14, and the main body portion 31 of the pivot member 20 is disposed flush against a second side of the frame 14. In the alternative, a washer, or shoulder, maybe provided on the thumb screw 22 for clamping the flange 42 of the rack frame 14 between the planar surface of the clasp member 26 and such washer, or shoulder, of the thumb screw 22. The thumb screw 22 and the two locating tabs 32 will prevent movement of the pivot mounting bracket 22 in the direction which is perpendicular to the plane of the planar surface 33 of the clasp member 26 and the plane of contact between the pivot member 20 and flange 42 of the frame 14.

Figure 6:
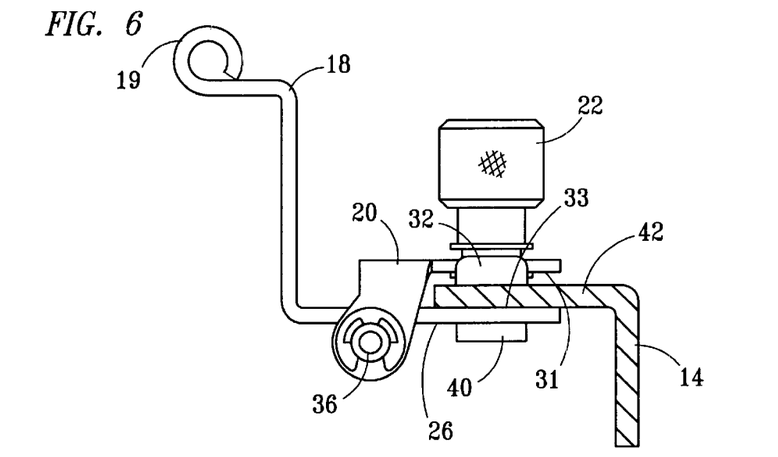
FIG. 6 is a sectional view of the pivot mounting bracket and the frame of the server system rack taken along section line 6—6 of FIG. 5, and showing the pivot mounting bracket in the latched position.

FIG. 6 is a sectional view of the pivot mounting bracket 12 taken along section line 6—6 of FIG. 5. The pivot mounting bracket 12 is shown disposed in the latched position. The planar surface 33 of the clasp member 26 fits flush against a second planar surface of the flange portion 42 of the rack frame 14. The bracket plate 18 is pivotally mounted to the hinge pin 36. The two tabs 32 (one shown) of the clasp member 26 are extending through the mounting apertures 16 in the flange 42 of the rack frame 14 to locate the pivot mounting bracket 12 with respect to the rack frame 14. The thumb screw 22 is aligned with and screwed into one of the clinch nuts 40 of the clasp member 26. The main body portion 31 of the pivot member 20 is disposed on an opposite side of the flange portion 42 from the planar surface 33 of the clasp member 26.

Figure 7:
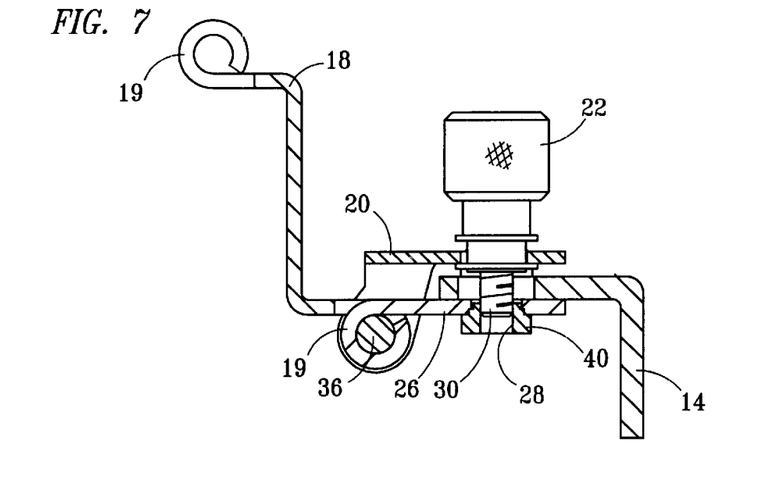
FIG. 7 is a sectional view of the pivot mounting bracket and the frame of the server system rack taken along section line 7—7 of FIG. 5, and showing the pivot mounting bracket the latched position.

FIG. 7 is a sectional view of the pivot mounting bracket 12, taken along section line 7—7 of FIG. 5. The pivot mounting bracket 12 is shown disposed in the latched position. The clinch nuts 40 are fixedly secured to the clasp member 26. The threaded shank 30 of the thumb screw 22 is threadingly secured within the threaded hole 28 of the clinch nuts 40. One of the hinge loops 19 of the clasp member 26 is shown extending around the pin member 36 to pivotally secure the clasp member 26 to the pin 36. The bracket plate 18 is also pivotally secured to the pin member 36 by hinge loops 19. The pivot member 20 is pivotally secured to the pin member 36 by the pin member 36 fitting within the apertures 35 of the mounting ears 34 (shown in FIG. 3). The respective hinge loops 19, the apertures 35 of the mounting ears 34 and the pin member 36 together define a hinge means, which are common to the bracket plate 18, the pivot member 20 and the clasp member 26 for rotatably securing the bracket plate 18, the pivot member 20 and the clasp member 26 to the pin member 36.

Figure 8:
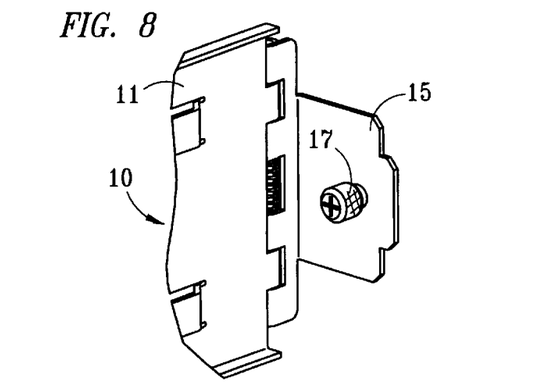
FIG. 8 is a partial, perspective view of the cable management arm and a second mounting bracket.

FIG. 8 is a partial, perspective view of the cable management arm 10 and a forward mounting bracket 15. The forward mounting bracket 15 has a thumbscrew 17, similar to the thumbscrew 22 of the pivot mounting bracket 12. The forward mounting bracket 15 is mounted to one of the linkages 11 of the cable management arm 10. Preferably, the bracket 15 has a planar surface which is mounted flush with a rearward, planar surface of a cabinet of the equipment drawer 4. The thumbscrew 17 will threadingly secure to the equipment drawer 4.

In operation, one end of the cable management arm 10 is mounted to the rack frame 14 by means of the forward mounting bracket 15 and the pivot mounting bracket 12. The forward end of the cable management arm 10 is secured to the equipment drawer 4 by the thumbscrew 17 extending through the forward mounting bracket 15 and into a threaded hole in the rearward end of the equipment drawer 4. The pivot mounting bracket 12 is mounted first mounted to the cable management arm 10. The rearward end of the cable management arm 14 is secured to the frame 14 of the server system rack frame 25 by means of the pivot mounting bracket 12. The pivot mounting bracket 12 is secured to the rack frame 25 by first rotating the pivot member 20 away from the clasp member 26 of the bracket plate 18. Then, the two locating tabs 32 are extended through two of the square mounting apertures 16 in the flange portion 42 of the frame 14. The thumb screw 22 is then moved within the slot 24 until it is aligned with one of the mounting holes 16 of the frame 14 and one of the threaded holes 28 of the clinch nuts 40 of the clasp member 16. The pivot member 20 is then rotated toward the clasp member 26 and the flange 42, such that the thumb screw 22 is then passed through the respective mounting hole 16 and into the respective one of the threaded holes 28 of the clinch nuts 40.

The thumb screw 22 is then threadingly secured into the threaded holes 28 in the clinch nut 40. The head 23 of the thumb screw 22 is grasped by the user and rotated to threadingly secure the thumb screw 22 to the clinch nuts 40, which secures the pivot member 20 against one side of the frame 14, and the clasp member portion 26 against a second side of the frame 14 with the locating tabs 32 extending through respective ones of two of the square mountings hole 16. A first side of the bracket plate 18 is rotatably secured to the pivot member 20 and the clasp member 26. A second side of the bracket plate 18 has hinge loops 19 which are rotatably secured to the pin 21 and one of the linkages 11.

The present invention provides advantages over the prior art. A pivot mounting bracket is provided having toolless fastener, such as a thumb screw, which threadingly secures a pivot member to a clasp member of the mounting bracket, with a flange portion of the rack frame disposed between the clasp member and the pivot member. The clasp member includes two locating tabs which extend through the rack frame to locate the mounting bracket relative to the rack frame. The clasp member, the pivot member and a bracket plate are pivotally mounted to a pin member. The shank of the thumbscrew and the two locating tabs of the clasp member fit within respective ones of the mounting apertures of the rack frame. The slot in the pivot mounting bracket for receiving the captive thumb screw has an elongated shape such that the thumb screw to be slidably moved within the elongated slot between positions for alignment with the threaded holes in the clasp member defined by the threaded holes 28 of the clinch nuts 40. In particular, one of the threaded holes 28 will be aligned with an intermediate mounting hole of the rack frame for receiving the threaded shank 30 of the thumb screw 22. The intermediate mounting hole of the rack frame is disposed between the two mounting holes which receive respective ones of the locating tabs. Preferably, the elongated slot in the pivot member and the threaded holes in the clasp member, or arranged such that the pivot mounting bracket may be used in either a right-hand or a left-hand position with respect to the rack frame of the server system rack.

Although the preferred embodiment has been described in detail, it should be understood that various changes, substitutions and alterations can be made therein without departing from the spirit and scope of the invention as defined by the appended claims.

What is claimed is:

1. A mounting bracket for mounting to a rack frame of a server system rack of a type having mounting apertures, said mounting bracket comprising:
   a pin member;
   a clasp member having a clasp member body and at least one clasp member socket for receiving said pin member to pivotally secure said clasp member to said pin member;

said clasp member further having a clasp member aperture formed into said clasp member body, and a locating tab which extends at a right angle to a plane of said clasp member body for fitting within a first one of said mounting apertures of said rack frame;

a pivot member having a pivot member body, two pin member mounting apertures, and a slot formed into said pivot member body which extends between opposite ends of said pivot member body, wherein said two pin member mounting apertures are disposed for rotatably receiving said pin member; and a mounting bracket fastener having a shank for extending through said pivot member slot, through one of said mounting apertures of said rack frame and into said clasp member aperture for securing said pivot member in fixed relation to said clasp member with a portion of said rack frame disposed therebetween, with said locating tab disposed in the first one of said mounting apertures of said rack frame.

2. The mounting bracket of claim 1, further comprising a bracket plate having a bracket plate body and at least one bracket plate socket for receiving said pin member to pivotally secure said bracket plate to said pin member.

3. The mounting bracket of claim 2, wherein said pin member comprises a single pin member of cylindrical shape, having opposite ends in which are defined two grooves, respectively, for receiving a fastening member in one of said two grooves and a second fastening member in the other of said two grooves.

4. The mounting bracket of claim 1, further comprising two grooves are formed into end sections of said pin member and two snap clips which are received in said two grooves of said pin member.

5. The mounting bracket of claim 1, further comprising a bracket plate which includes two spaced apart, ends, wherein one of said ends defines hinge loops which extend around said pin member and which extend between said mounting apertures of said pivot member.

6. The mounting bracket of claim 5, wherein said at least one clasp member socket intermeshes with said hinge loops of said bracket plate.

7. A mounting bracket for mounting to a rack frame of a server system rack, the rack frame being of a type having mounting apertures which are spaced apart in a regular pattern that runs a length of the rack frame, said mounting bracket comprising:

a pin member;

a clasp member having a clasp member body and clasp tabs which extend from one end of said clasp member body, said clasp tabs being formed into clasp member loops to define clasp member sockets for receiving said pin member to pivotally secure said clasp member to said pin member;

said clasp member further having a clasp member aperture formed into said clasp member body and two locating tabs which extend at right angles to a plane of said clasp member body, wherein said two locating tabs are sized for fitting within respective ones of two of said mounting apertures of said rack frame;

a pivot member having a pivot member body, two mounting ears which extend from opposite ends of said pivot member body, and a slot formed into said pivot member body which extends between said opposite ends of said pivot member body, wherein said two mounting ears are formed to extend transverse to said pivot member body, and said mounting ears having respective mounting ear apertures for pivotally receiving said pin member; and a mounting bracket fastener having a head which is larger than a width of said slot in said pivot member, and a shank which is sized for passing through said slot, one of said mounting apertures of said rack frame and through said clasp member aperture for securing said pivot member in fixed relation to said clasp member.

8. The mounting bracket of claim 7, wherein said pin member has an exterior periphery of cylindrical shape.

9. The mounting bracket of claim 8, wherein grooves are formed into end sections of said pin member and two end fasteners comprise snap clips which are received in said grooves of said pin member to secure said pin member within said respective mounting ear apertures of said pivot member.

10. The mounting bracket of claim 7, further comprising a bracket plate which includes two spaced apart, ends, wherein one of said ends defines hinge loops which extend around said pin member and which extend between said mounting ears of said pivot member.

11. The mounting bracket of claim 10, wherein said clasp member sockets are spaced apart and intermesh with various ones of said bracket plate.

12. A mounting bracket for mounting to a rack frame of a server system rack, the rack frame being of a type having mounting apertures which are spaced apart in a regular pattern that runs a length of the rack frame, said mounting bracket comprising:

a pin member having a cylindrically-shaped periphery, and two spaced apart grooves formed circumferentially into end sections of said cylindrically-shaped periphery, wherein said grooves are spaced apart for disposing on opposite sides of said mounting bracket;

a clasp member having a clasp member body and clasp tabs which extend from one end of said clasp member body, said clasp tabs being formed into clasp member loops to define clasp member sockets for receiving said pin member to pivotally secure said clasp member to said pin member;

said clasp member further having two spaced apart, threaded apertures formed into said clasp member body and two locating tabs which extend at right angles to a plane of said clasp member body, wherein said two locating tabs are sized for fitting within respective ones of two of said mounting apertures of said rack frame;

a pivot member having a pivot member body, two mounting ears which extend from opposite ends of said pivot member body, and a slot formed into said pivot member body which extends between said opposite ends of said pivot member body to register with said two, spaced apart, threaded apertures of said clasp member, and wherein said two mounting ears extend transverse to said pivot member body and are spaced apart to fit inward of and substantially adjacent to said two spaced apart grooves in said pin member, and said mounting ears having respective mounting ear apertures for receiving said pin member;

clip fasteners for securing in said grooves of said pin member to pivotally secure said pin member in said mounting ear apertures; and a thumb screw having a head which is larger than a width of said slot in said pivot member body, and a shank which is sized for slidably extending within said slot, and passing from said slot through one of said mounting apertures of said rack frame and into a threaded engagement with one of said threaded apertures of said clasp member.

13. The mounting bracket of claim 12, wherein said pivot member body has a planar portion in which said slot extends, said planar portion of said pivot member body extends for aligning said slot with at least one of said mounting apertures in said rack frame, with said two locating tabs of said clasp member being disposed in the respective ones of the two of said mounting apertures in said rack frame, such that said shank of said thumb screw passes through the one of said mounting apertures and into said clasp aperture of said clasp member body.

14. The mounting bracket of claim 13, further comprising a bracket plate which includes two spaced apart, ends, wherein one of said ends defines hinge loops which extend around said pin member and which extend between said two mounting ears of said pivot member.

15. The mounting bracket of claim 14, wherein said clasp member sockets are spaced apart and intermesh with various ones of said hinge loops of said bracket plate.

* * * * *